United States Patent [19]

Dobbelaere

[11] Patent Number: 5,440,182
[45] Date of Patent: Aug. 8, 1995

[54] DYNAMIC LOGIC INTERCONNECT SPEED-UP CIRCUIT

[75] Inventor: Ivo J. Dobbelaere, Palo Alto, Calif.

[73] Assignee: The Board of Trustees of the Leland Stanford Junior University, Stanford, Calif.

[21] Appl. No.: 142,900

[22] Filed: Oct. 22, 1993

[51] Int. Cl.$^6$ ............................................. H03K 19/01
[52] U.S. Cl. ........................................ 326/38; 326/17; 326/45; 326/83; 327/76
[58] Field of Search ............... 307/443, 451, 452, 465, 307/465.1, 475, 264, 360, 362

[56] References Cited

U.S. PATENT DOCUMENTS

| | | | |
|---|---|---|---|
| 4,446,382 | 5/1984 | Moore et al. | 307/443 X |
| 4,498,021 | 2/1985 | Uya | 307/443 |
| 4,598,216 | 7/1986 | Lauffer et al. | 307/443 |
| 4,621,202 | 11/1986 | Pumo | 307/443 X |
| 4,700,086 | 10/1987 | Ling et al. | 307/452 X |
| 4,763,023 | 8/1988 | Spence | 307/451 X |
| 4,883,989 | 11/1989 | Mizukami | 307/443 X |
| 5,122,685 | 6/1992 | Chan et al. | 307/465.1 |
| 5,140,193 | 8/1992 | Freeman et al. | 307/465 |
| 5,202,593 | 4/1993 | Huang et al. | 307/475 |

OTHER PUBLICATIONS

Glasser, L. A., and Dobberpuhl, D. W., *The Design and Analysis of VLSI Circuits*, c. 1985, Addison-Wesley, Reading, Mass., pp. 419–420.

Ogura, T., et al., "A 20-kbit Associate Memory LSI for Artificial Intelligence Machines," IEEE Journal of Solid State Circuits, V. 24, No. 4, Aug. 4, 1989, p. 1018.

*Primary Examiner*—David R. Hudspeth

[57] ABSTRACT

A circuit style, which may be employed in fast, area-efficient, flexible programmable interconnect architectures, is disclosed. In one embodiment, a plurality of clocked dynamic logic circuits, each having a single network node, is connected to the intermediate nodes of a programmable interconnect architecture. During the precharge clock phase, the circuits precharge the intermediate nodes to a high logic level. During the evaluation clock phase, each circuit is initially in the stand-by state, in which it monitors the logic level on its network node. If a substantial deviation from the high level towards the low level is detected, the circuit switches to the discharge state, in which it enforces that level change by connecting its network node to the low level. This causes the potential on neighboring nodes, connected through conducting programmable switches, to change towards a low level, and their circuits in turn switch to the discharge state. Thus, a forced high-to-low level change on a node during the evaluation clock phase quickly propagates to its connected nodes.

2 Claims, 9 Drawing Sheets

DYNAMIC LOGIC INTERCONNECT SPEED-UP CIRCUIT

CROSS-REFERENCE TO RELATED PATENT APPLICATIONS

Co-pending U.S. patent application entitled "SPEED-UP CIRCUIT," Ser. No. 08/147,901 filed concurrently herewith, is incorporated herein by reference.

FIELD OF THE INVENTION

The present invention relates to integrated circuit (IC) technology. More specifically, the present invention pertains to fast circuits for realizing programmable interconnect architectures among circuitry on one integrated circuit, and among circuitry on different integrated circuits. The circuit technique of the present patent is called "Evaluation Speed-Up" interconnect circuitry, abbreviated ESU.

BACKGROUND OF THE INVENTION

Programmable interconnect architectures are used in user-programmable arrays of logic cells, also referred to as "Field Programmable Gate Arrays (FPGAs)", as well as in dedicated programmable interconnect chips, microprocessors, digital signal processor cores, etc.

Such programmable interconnect architectures typically consist of a network of conductive nodes, programmable passive switches, and programmable or non-programmable repeater circuits. An interconnection from one conductive node to another is obtained by programming the intermediate passive switches to be conducting, and by programming each repeater circuit to be propagating and enhancing the signal from one of its terminals to another. The signal enhancement through a repeater circuit consists of driving the output with a low-impedance version of the logic signal at the input.

The repeater circuits are necessary to limit the propagation delay and the signal rise/fall time in cases where the interconnection contains many passive switches in sequence. The delay through such a network can be approximately modeled as an "RC-chain", and hence both propagation delay and rise/fall time are roughly proportional to the square of the number of switches traversed. The network of switches and repeaters can be optimized to have minimum worst case propagation delay, and an acceptable signal rise/fall time, under a given layout area constraint. The optimization consists of finding the best combination of repeater circuit sizing, switch sizing, and switch-to-repeater ratio. The switch-to-repeater ratio is the worst case number of switches between repeaters in the path of an interconnection.

The design trade-offs may be explained as follows. As the switches are made larger, their on-resistance becomes smaller, but the capacitance added to the conductive nodes becomes larger. Second order factors such as fringe capacitance, and the non-linear voltage dependence of the on-resistance of the switches, as well as the size of the repeater, must be considered to find the best switch size. Placing repeaters at every conductive node is possible if there is no area constraint. However, repeaters have an inherent propagation delay. When placed at every node, the repeater propagation delay dominates the total propagation delay.

In a realistic programmable interconnect architecture, a layout area constraint must be considered. In bi-directional, two-dimensional programmable interconnect architectures, such as the ones used in FPGAs, the repeater area is very large: the bi-directionality and the two-dimensionality may require a redundancy of a factor two or larger in the number of three-state buffers: not more than half the buffers, but usually fewer, are actually used when programmed. The fact that three-state buffers are employed implies large circuits and additional area overhead because of the need for memory cells in the repeaters.

In conclusion, the area and performance of programmable bi-directional interconnect architectures may be improved efficiently by employing a bi-directional repeater circuit with a small propagation delay and a small area.

*The Design and Analysis of VLSI Circuits* (L. Glasser and D. Dobberpuhl, Addison-Wesley Publishing Company, Reading, Mass., 1985, p. 420, FIG. 8.5) shows a carry chain employing a precharge PMOS transistor and an evaluation circuit with feedback on each intermediate node of the carry chain. However, that circuit is directed to providing a short propagation time in a unidirectional carry chain. It does not address the use of such a precharge and evaluation circuit in a programmable interconnect architecture, and it does not address the use of such a precharge and evaluation circuit for bi-directional signal propagation.

Journal article "A 20-kbit Associative Memory LSI for Artificial Intelligence Machines" by T. Ogura et al., in the IEEE Journal of Solid State Circuits, Vol. 24, No. 4, August 1989, p. 1018, FIG. 6, shows an accelerator circuit employing feedback, using a PMOS transistor as a detection circuit and an NMOS transistor as an evaluation circuit. However, that circuit is directed to speeding up the discharging of a match line in a content addressable memory cell, and it does not address the use of such an accelerator circuit for programmable interconnect architectures.

U.S. Pat. No. 5,202,593 to T. Huang et al. discloses a bi-directional bus repeater that does not need a direction setting control signal. However, that circuit is directed to providing automatic sensing of the signal propagation direction in a bus repeater and does not provide the improvement in the rise/fall time of the input signal offered by the current invention, which has concurrently active drivers on both the input and output network nodes.

OBJECTS OF THE INVENTION

Accordingly, it is a principal object of the invention to provide a bi-directional repeater circuit with a smaller layout area and a smaller propagation delay than existing circuits, that enables the design of programmable interconnect architectures with smaller layout area and smaller propagation delays than existing architectures, that can be added to intermediate nodes of programmable interconnect architectures in a modular fashion, and that is bi-directional.

It is another principal object of the invention to provide a two-terminal bi-directional repeater circuit with a smaller propagation delay than existing circuits, along with improved input signal rise/fall time characteristics, as a result of having concurrently active drivers on both input and output nodes.

It is an additional object of the invention to provide circuits for fast, bi-directional on-chip and inter-chip programmable interconnections.

It is an additional object of the invention to provide circuits for placement along on-chip or off-chip electrical conductors, in order to improve the electrical behavior of the interconnection.

Other objects and features of the invention will become apparent to those skilled in the art in light of the following description and drawings of the preferred embodiment.

BRIEF DESCRIPTION OF THE INVENTION

In accordance with the present invention, a dynamic logic interconnect speed-up circuit for use in electrically programmable interconnect architectures is disclosed. In a programmable interconnect architecture consisting of a plurality of conductive nodes interconnected by programmable passive switches, this circuit acts as a bi-directional repeater with negligible added propagation delay, and with a minimum redundancy in the number of driver transistors, resulting in faster and more area efficient circuits.

In one embodiment, a plurality of clocked dynamic logic circuits, each having a single network node, is connected to the intermediate nodes of a programmable interconnect architecture. During the precharge clock phase, the circuits precharge their network nodes to a high logic level. During the evaluation clock phase, each circuit is initially in the stand-by state, where it monitors the logic level on its network node. If a substantial deviation from the high level towards the low level is detected, the circuit switches to the discharge state, where it enforces that level change by connecting its network node to the low level. This causes the potential on neighboring nodes, connected through conducting programmable switches, to change towards a low level, and their circuits in turn switch to the discharge state. Thus, a forced high-to-low level change on a node during the evaluation clock phase quickly propagates to its connected nodes.

The dynamic logic circuit consists of a precharge circuit and an evaluation speed-up circuit. A first implementation of this embodiment consists of a DOMINO-style buffer with its output connected to its input, and with the internal capacitive node of the DOMINO circuit as the network node. Another implementation of this first embodiment consists of a PMOS precharge transistor between the network node and the high logic level, with its gate connected to the clock; and a two-input CMOS NOR-gate with its output and one input connected to the network node while the other input is connected to the inverse of the clock.

Also in accordance with the present invention, a bi-directional two-terminal bus repeater, compatible with dynamic logic, is disclosed. This bus repeater has two terminals connected to intermediate nodes of a programmable interconnect architecture. During the precharge clock phase, the circuit precharges both nodes connected to its two terminals to a high level. During the evaluation clock phase, the circuit is initially in the stand-by state, where it monitors the logic level on its two terminals. If a substantial deviation from the high level towards the low level is detected on either one of the two terminals, the circuit switches to the discharge state, where it enforces that level change by connecting both of its terminals to the low level. Thus, a forced high-to-low level change on one network node during the evaluation clock phase is enforced on that node, improving the signal fall time, and in addition quickly propagates to the other network node.

The bi-directional two-terminal bus repeater and the dynamic logic interconnect speed-up circuit both employ similar circuitry, called an evaluation speed-up circuit, and they may be used in combination. The bi-directional two-terminal bus repeater specifically performs better when the capacitive load of two neighboring nodes is substantially different. It also performs better for off-chip interconnections, where one such circuit is placed at each sending or receiving end of a multi-point inter-chip interconnection.

No additional circuitry or programming of the programmable interconnect architecture is necessary to enable the propagation of a signal in the reverse direction: the circuits are inherently bi-directional.

BRIEF DESCRIPTION OF THE DRAWINGS

FIGS. 4b and 4c show complementary embodiments of the dynamic logic interconnect speed-up circuit in FIG. 4a.

FIGS. 5a and 5b show the schematics of complementary embodiments of the dynamic logic interconnect speed-up circuit in FIG. 4a.

FIGS. 6a and 6b show the schematics of complementary embodiments of the dynamic logic interconnect speed-up circuit in FIG. 4a.

FIGS. 7a and 7b show the schematics of semi-static embodiments of the dynamic logic interconnect speed-up circuit in FIG. 4a.

FIG. 9 shows the schematic of an embodiment of the bi-directional two-terminal bus repeater in FIG. 8a.

FIG. 10 shows a view of an illustrative embodiment of the bi-directional two-terminal bus repeater in FIG. 8a.

DETAILED DESCRIPTION OF SPECIFIC EMBODIMENTS

Throughout this description, the same labels have been used for like elements.

Figure 1:
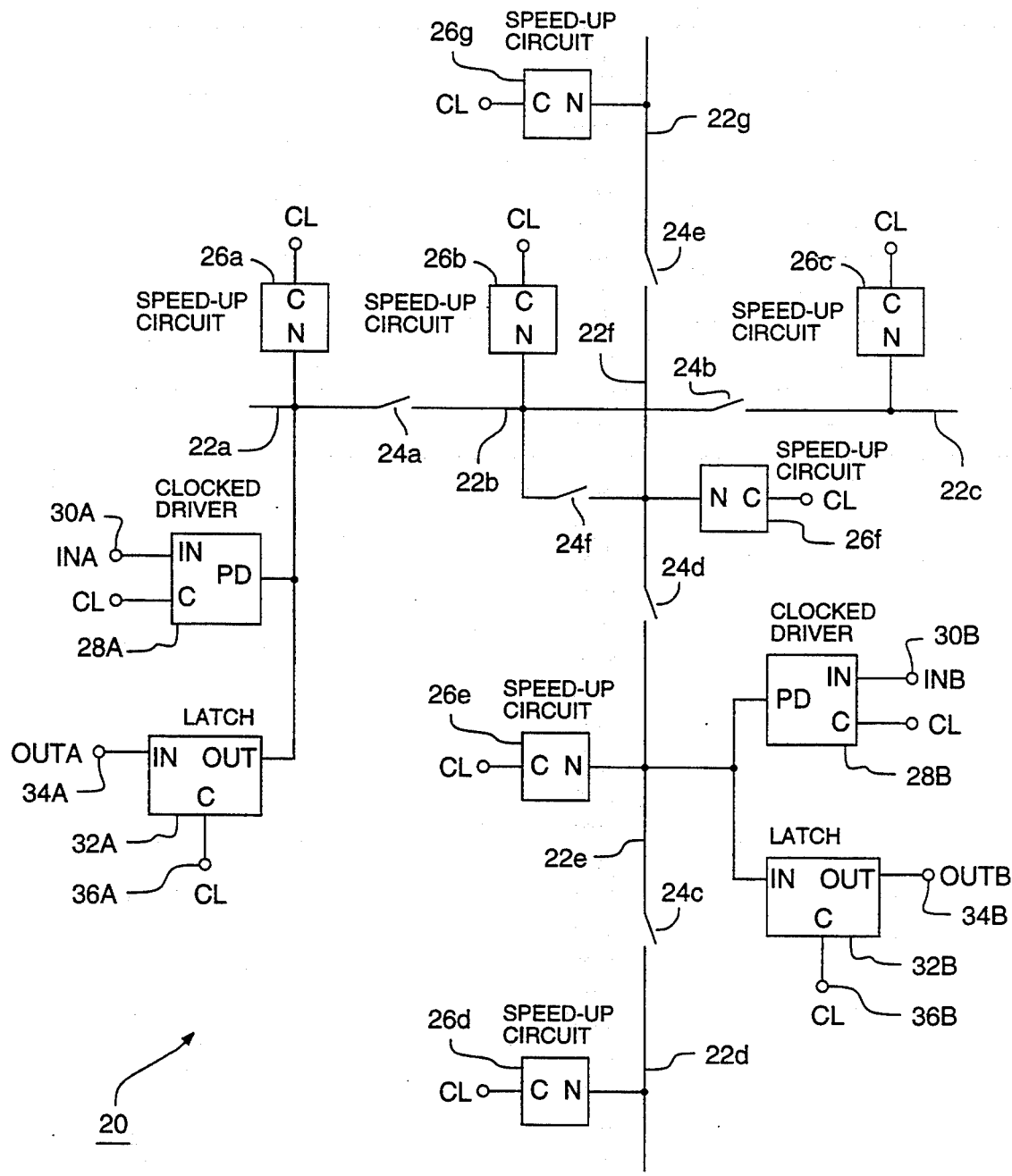
FIG. 1 is a block diagram of an illustrative embodiment of the present invention.

It is necessary to show an example of a programmable interconnect architecture in order to explain the dynamic logic interconnect speed-up circuit. FIG. 1 depicts an illustrative embodiment of a programmable interconnect architecture 20 consisting of seven conductive nodes 22a–22g interconnected by six programmable switches 24a–24f, two driver circuits 28A and 28B for sending signals to programmable interconnect architecture 20, an input node 30A, also referred to as INA, an input node 30B, also referred to as INB, two receiving circuits 32A and 32B for receiving signals from programmable interconnect architecture 20, an output node 34A, also referred to as OUTA, an output node 34B, also referred to as OUTB, two clock nodes 36A and 36B, and seven dynamic logic interconnect speed-up circuits 26a–26g according to the present invention. Receiving circuits 32A and 32B are latches. Latches 32A and 32B are transparent when a first predetermined logic level is asserted at their clock input C, on clock nodes 36A and 36B, respectively. When latches 32A and 32B are transparent, the signals appearing at their inputs IN also appear at their outputs OUT. When a second predetermined logic level is asserted at clock inputs C of latches 32A and 32B, the logic levels present at their outputs OUT are stored, and the levels are retained at outputs OUT regardless of a subsequent level change at inputs IN. Dynamic logic interconnect speed-up circuits 26a–26g each have a network terminal N and a clock input C connected to a clock CL. For clarity, the connections of dynamic logic interconnect speed-up circuits 26a–26g to the positive supply VDD and to the ground node have been omitted in FIG. 1.

Figure 2:
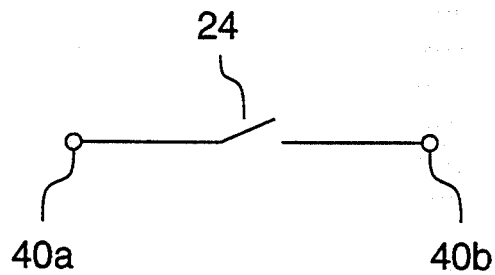
FIG. 2 shows a block diagram of the programmable bi-directional switch in FIG. 1.

FIG. 2 shows a block diagram of a programmable switch 24, having its two terminals connected to two nodes 40a and 40b, respectively. Programmable switch 24 has two programming states. In a first programming state, further referred to as the non-conducting state, a high impedance is present between the two terminals. In a second programming state, further referred to as the conducting state, a low impedance bi-directional electrical interconnection is realized between the two terminals. Many different embodiments of programmable switch 24 are known, such as: an NMOS/PMOS pass transistor pair with programmable element; an NMOS pass transistor driven by a programmable element with a high gate voltage that exceeds the signal high level by at least the threshold voltage of the transistor; antifuses; etc. These embodiments are known to those of ordinary skill in the art.

Figure 3:
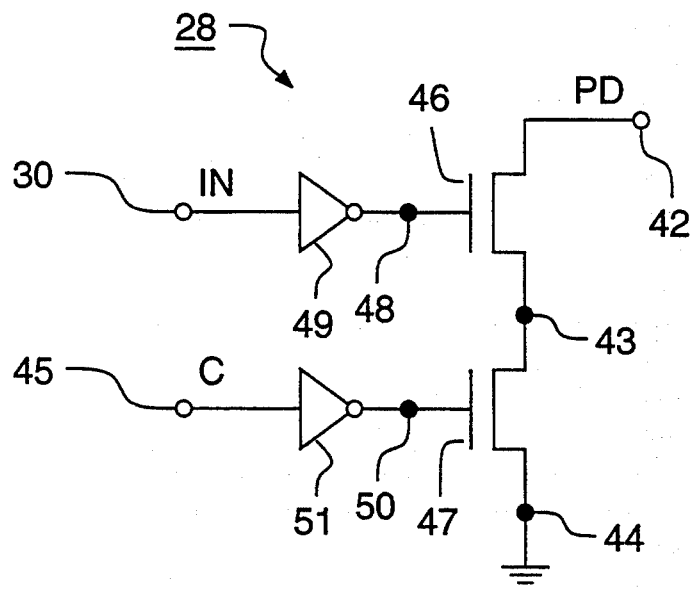
FIG. 3 shows an embodiment of the input circuit in FIG. 1.

FIG. 3 shows an embodiment of driver circuit 28 in FIG. 1. Driver circuit 28 comprises a pull-down node 42, also referred to as PD, an input node 30, also referred to as IN, a clock input node 45, also referred to as C, and a ground node 44. Input circuit 28 also comprises two NMOS transistors 46 and 47, two intermediate nodes 48 and 50, and two inverters 49 and 51. NMOS transistor 46 has its gate connected to intermediate node 48, has a first current electrode connected to pull-down node 42, and has a second current electrode connected to intermediate node 43; NMOS transistor 47 has its gate connected to intermediate node 50, has a first current electrode connected to intermediate node 43, and has a second current electrode connected to ground node 44. Inverter 49 has its output connected to intermediate node 48 and has its input connected to input node 30. Inverter 51 has its output connected to intermediate node 50 and has its input connected to clock input node 45.

While a high logic level is present on clock input node 45, a low logic level is present at the output of inverter 51, on intermediate node 50, and NMOS transistor 47 is OFF. Hence, driver circuit 28 provides an open circuit at its pulldown node 42. When a low logic level appears on clock input node 45, and a high logic level is present on input node 30, a low logic level is present at the output of inverter 49, on intermediate node 48, and NMOS transistor 46 is OFF. Hence, driver circuit 28 provides an open circuit at its pull-down node 42. When a low logic level is present on both clock input node 45 and input node 30, a high level appears on both intermediate nodes 48 and 50, and both NMOS transistors 46 and 47 are ON. Hence, driver circuit 28 provides a low-impedance connection between pull-down node 42 and ground node 44, thus causing the discharge of pull-down node 42. Many variations of such dynamic logic input devices are known.

Figure 4A:
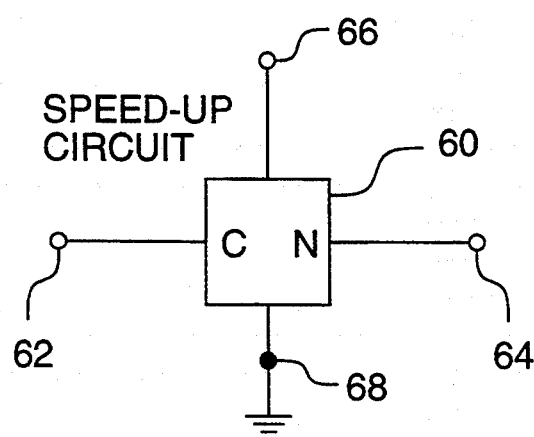
FIG. 4a shows a block diagram of the dynamic logic interconnect speed-up circuit in FIG. 1.

FIG. 4a shows a block diagram of a dynamic logic interconnect speed-up circuit according to the present invention. Embodiment 60 comprises a network terminal N connected to a network node 64, a clock input C connected to a clock input node 62, a connection to a voltage node 66, and a connection to a ground node 68.

When a first logic level, called the precharge clock level, is asserted on clock input node 62, embodiment 60 precharges network node 64 to the high logic level on supply voltage node 66. This condition will also be referred to as the precharge phase. The condition where a second logic level, called the evaluation clock level, is asserted on clock input node 62, will be referred to as the evaluation phase. If, during the evaluation phase, a sufficiently high level is present on network node 64, due to capacitive charge storage after having been precharged, embodiment 60 is in the standby state, in which it provides a high impedance open circuit on network node 64. If network node is forced low due to an external circuit, below a predetermined threshold, embodiment 60 detects the level change and goes to the discharge state, in which it starts enforcing the level change on network node 64 by connecting network node 64 to the low level on ground node 68.

Many variations on this circuit principle are possible. The clock phase under which precharge and evaluation occur may be exchanged; or it may be made programmable. The precharging may be to the high level or to the low level.

Figure 4B:
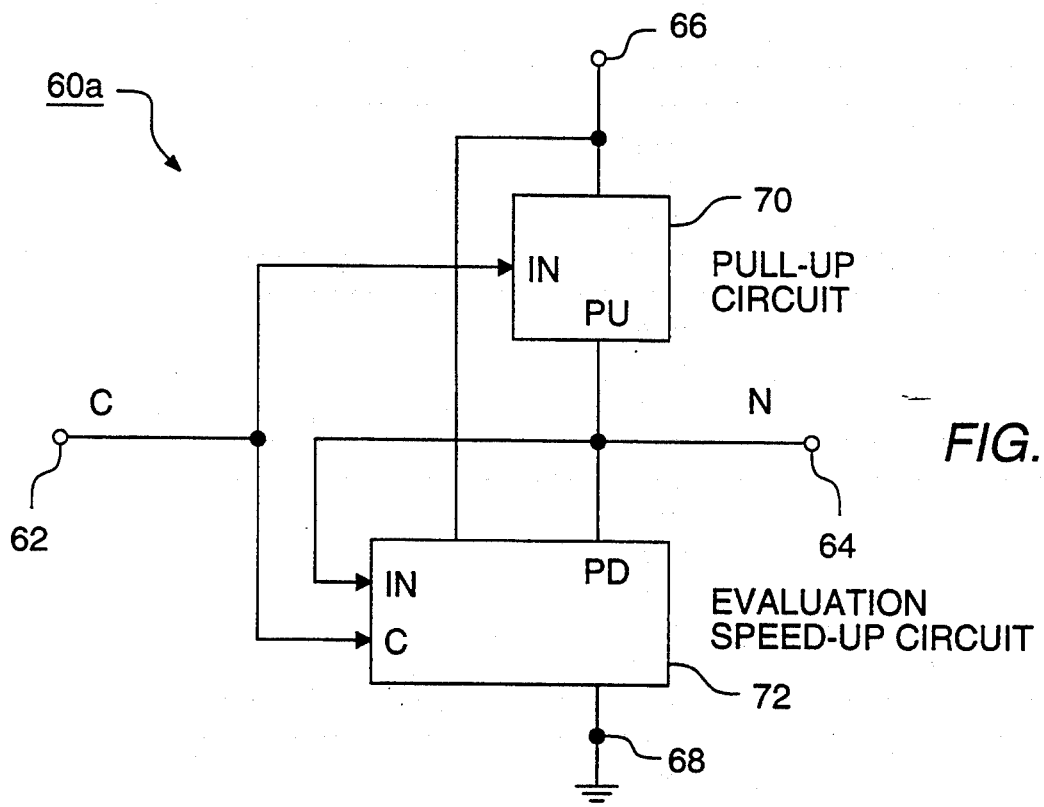

FIG. 4b shows a more detailed block diagram of an embodiment 60a of a dynamic logic interconnect speed-up circuit according to the present invention. Embodiment 60a comprises network node 64, clock input node 62, supply voltage node 66, and ground node 68. Embodiment 60a further comprises a pull-up circuit 70 for precharging network node 64 to a high logic level, having an input IN connected to clock input 62, having a pull-up node PU connected to network node 64, and having a connection to supply voltage node 66. Embodiment 60a further comprises an evaluation speed-up circuit 72, having a clock input C connected to clock input 62, having an input IN connected to network node 64, having a pull-down node PD connected to network node 64, having a connection to supply voltage node 66, and having a connection to ground node 68.

The operation of embodiment 60a shown in FIG. 4b is as follows. When a first logic level, called the precharge clock level, is asserted at input IN of pull-up circuit 70, a low-impedance interconnection is established between supply voltage node 66 and pull-up node PU connected to network node 64. When the precharge clock level is asserted at clock input C of evaluation speed-up circuit 72, a high impedance, equivalent to an open circuit, is provided at pull-down terminal PD of evaluation speed-up circuit 72, regardless of the level that is present at the input IN of evaluation speed-up circuit 72. As a result, when the precharge clock level is asserted on clock input node 62, network node 64 is precharged to a high logic level through pull-up circuit 70. When a second logic level, called the evaluation clock level, is asserted at the input IN of pull-up circuit 70, a high impedance, equivalent to an open circuit, is provided at pull-up terminal PU of pull-up circuit 70. When the evaluation clock level is asserted at clock input C of evaluation speed-up circuit 72, and a high level is present on input IN, evaluation speed-up circuit 72 is in the stand-by state, in which it provides a high impedance at pull-down terminal PD, and meanwhile monitors the level at its input IN. When a deviation in logic level from the high level towards the low level, to below a predetermined threshold level, is detected on input IN, evaluation speed-up circuit 72 goes to its discharge state, in which it establishes a low-impedance interconnection between pull-down node PD and ground node 68. As a result, when the evaluation clock level is asserted on clock input 62, and a high level is present on network node 64, due to capacitive storage after having been precharged, both pull-up circuit 70 and evaluation speedup circuit 72 provide a high impedance equivalent to an open circuit at network node 64. At this point, the level on network node 64 may be forced low by external circuits, not shown in FIG. 4b. If, while the evaluation level is asserted on clock input 62, the level on network node 64 drops below a predetermined threshold, due to a circuit external to the circuit shown in FIG. 4b, evaluation speed-up circuit 72 establishes a low impedance connection between network node 64 and ground node 68, further enforcing the level change that was imposed on network node 64 by an external circuit.

We will refer to the phase where the precharge clock level is asserted by the system clock as the precharge phase, and the phase where the evaluation clock level is asserted by the system clock as the evaluation phase. By connecting clock input 62 to a system clock, network node 64 is now precharged to a high level during the precharge phase. During the evaluation phase, embodiment 60a monitors the level on network node 64, and if a substantial level change towards the low level is detected, a low level is enforced at network node 64 by embodiment 60a This may be used to quickly, in a bi-directional manner, transmit data across a programmable interconnect architecture of conductive leads interconnected by passive switches. For example, now referring back to FIG. 1, programmable switches 24a through 24f, as explained earlier, may be individually programmed to be either in the conducting or the non-conducting state. Assume now that programmable switches 24a, 24f and 24d are programmed to the conducting state, while the other programmable switches 24b, 24c, and 24e are programmed to the non-conducting state. This establishes a conductive path from conductive lead 22a, through conductive leads 22b and 22f, to conductive lead 22e, in which each of programmable switches 24a, 24f and 24d can be modeled by its on-resistance, and each of conductive leads 22a, 22b, 22f, and 22e can be modeled by the lumped capacitance contribution of each conductive lead and the input/output capacitances of the circuits connected to it. During the precharge phase, all conductive leads 22a through 22g are precharged to a high level by dynamic logic interconnect speed-up circuits 26a through 26g. During the evaluation phase, all dynamic logic interconnect speed-up circuits 26a through 26g am initially in the stand-by state and provide a high impedance open circuit at their network terminals N. As explained earlier, driver circuit 28A provides an open circuit at pull-down terminal PD except when its clock input C and its input IN are at a low level. Therefore, if during the low clock phase, a low level appears at input node 30A in FIG. 1, conductive lead 22a is pulled down by driver circuit 28A. Dynamic logic interconnect speed-up circuits 26a monitors conductive lead 22a, and when it detects a change below a certain threshold voltage, it goes to its discharge state and enforces a low level at its network terminal N. Meanwhile, conductive lead 22b is being discharged, through a resistive path through programmable switch 24a, and partly through pull-down terminal PD of input circuit 30A, partly through network terminal N of dynamic logic interconnect speed-up circuit 26a. Hence, in turn, if dynamic logic interconnect speed-up circuit 26b detects a change below a certain threshold voltage on conductive lead 22b, it goes to its discharge state, and enforces a low level at its network terminal N. Meanwhile, conductive lead 22f and 22e are being discharged in a similar way, and dynamic logic interconnect speed-up circuits 26f and 26e switch to the discharge state in turn, and start enforcing a low level. Finally, the level on conductive lead 22e turns low. Receiving circuit 32B is a latch and is designed to be transparent during a evaluation clock phase, meaning that the input signal on input IN appears at its output OUT. When the clock changes back to the precharge phase, receiver circuit 32B latches the value present at its output OUT. Hence, a high-to-low transition on input node 30A quickly propagates through programmable interconnect architecture 20 in the reverse direction, and appears on output node 34B, during an evaluation phase. Conversely, a high-to-low transition on input node 30B quickly propagates through programmable interconnect architecture 20 and appears on output node 34A, during an evaluation phase. Hence, a circuit style for providing fast, bi-directional interconnections is obtained. It can be shown that the delay through such a network is approximately a linear function of the number of switches traversed. Many variations are possible. It is not necessary to place dynamic logic interconnect speed-up circuits at every conductive lead. Alternatively, several dynamic logic interconnect speed-up circuits may be placed at different positions along a single conductive lead.

Figure 4C:
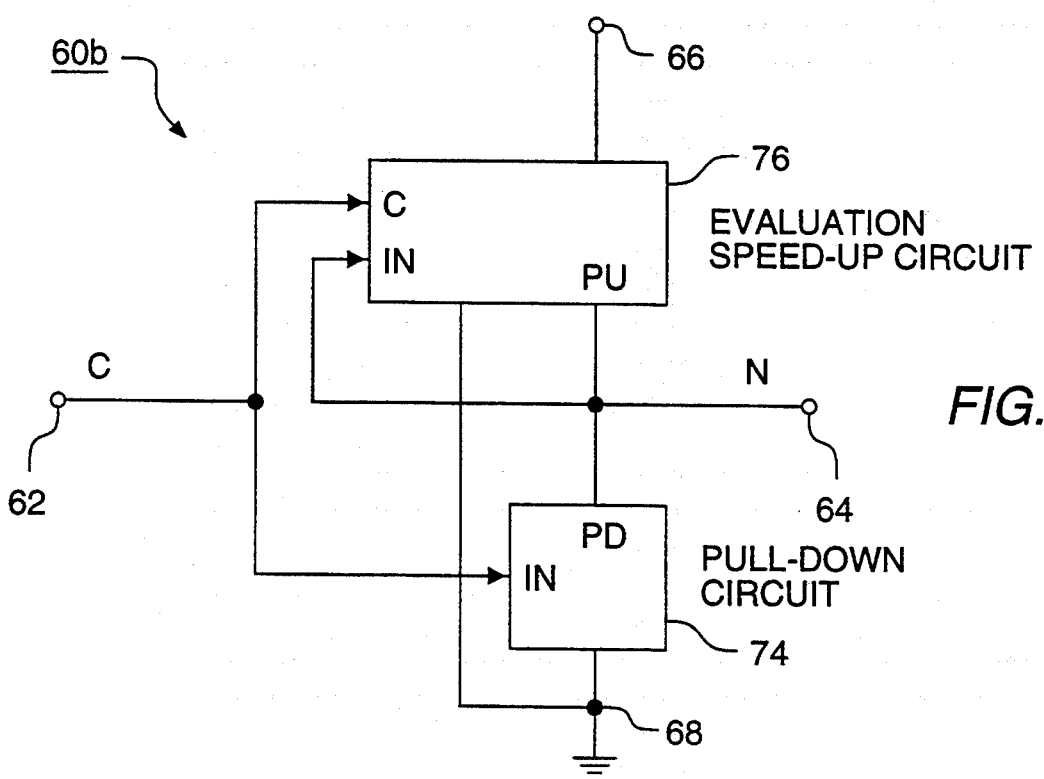

FIG. 4c shows a more detailed block diagram of an embodiment 60b of a dynamic logic interconnect speed-up circuit according to the present invention. Embodiment 60b comprises network node 64, clock input node 62, supply voltage node 66, and ground node 68. Embodiment 60b further comprises a pull-down circuit 74 for precharging network node 64 to a low logic level, having a control input IN connected to clock input 62, having a pull-down terminal PD connected to network node 64, and having a connection to supply voltage node 66. Embodiment 60b further comprises an evaluation speed-up circuit 76, having a clock input C connected to clock input 62, having an input IN connected to network node 64, having a pull-up terminal PU connected to network node 64, having a connection to supply voltage node 66, and having a connection to ground node 68.

The operation of embodiment 60b of FIG. 4c is the logic complement of the operation of embodiment 60a of FIG. 4b.

Figure 5A:
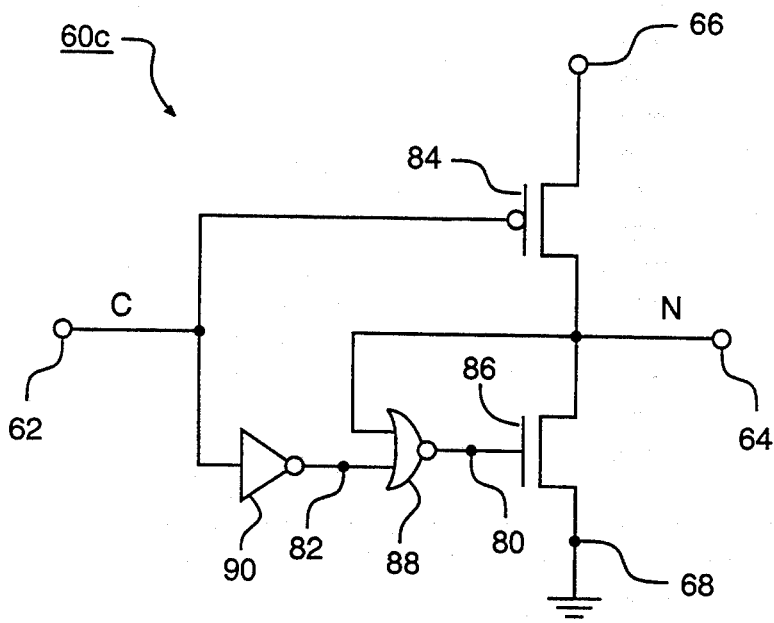

FIG. 5a shows a schematic of an embodiment 60c of a dynamic logic interconnect speed-up circuit according to the present invention. Embodiment 60c comprises network node 64, clock input node 62, supply voltage node 66, and ground node 68. Embodiment 60c further comprises a PMOS transistor 84 for precharging network node 64 to a high logic level, having its gate electrode connected to clock input node 62, having a first current electrode connected to network node 64, and having a second current electrode connected to supply voltage node 66. Embodiment 60c further comprises an NMOS transistor 86, an intermediate node 80, a logic NOR gate 88, an intermediate node 82, and an inverter 90. NMOS transistor 86 has its gate connected to intermediate node 80, has a first current electrode connected to network node 64, and has a second current electrode connected to ground node 68. Logic NOR gate 88 has its output connected to intermediate node 80, has a first input connected to network node 64, and has a second input connected to intermediate node 82. Inverter 90 has its output connected to intermediate node 82 and has its input connected to clock input node 62.

Still referring to FIG. 5a, when a low level is present on clock input node 62, PMOS transistor 84 is ON and precharges network node 64 to a high level. Inverter 90 inverts a low level on clock input node 62 to a high level on intermediate node 82. This causes the output of logic NOR gate 88, appearing on intermediate node 80, to be a low level, regardless of the level on the other input to logic NOR gate 88, which is connected to network node 64. As a result, when a low level is present on clock input node 62, NMOS transistor 86 is OFF.

When a high level is present on clock input node 62, PMOS transistor 84 is OFF. Inverter 90 inverts the high level on clock input node 62 to a low level on intermediate node 82. As long as this low level is present on intermediate node 82, logic NOR gate 88 may be viewed as an inverting circuit with its input connected to network node 64 and its output connected to intermediate node 80. We may thus define the trip point of logic NOR gate 88 to be the trip point of the equivalent inverter when one of its inputs is a low level. If, while a high level is present on clock input node 62, a high level is present on network node 64, due to capacitive storage after having been precharged, the output of logic NOR gate 88, appearing on intermediate node 80, is low, and NMOS transistor 86 is OFF. However, if, while a high level is still present on clock input node 62, the level on network node 64, due to an external circuit, is forced low, down to a value below the trip point of logic NOR gate 88, the output of logic NOR gate 88 turns into a high level, appearing on intermediate node 80. This causes NMOS transistor 86 to be turned ON. As a result, network node 64 is pulled down by NMOS transistor 86, in addition to being forced to a lower value by an external circuit. When NMOS transistor 86 is turned ON, other similar network nodes of similar neighboring circuits, not shown in FIG. 5a, connected to network node 64 through a programmable, resistive path, may now be discharged through NMOS transistor 86, and forced to a level below the trip point of their respective logic NOR gates. In this way, a high-to-low transition on one node in a programmable interconnect architecture may be quickly propagated to other, connected nodes.

If clock input node 62 turns back to the low logic level, network node 64 is being precharged again to the high logic level.

Figure 5B:
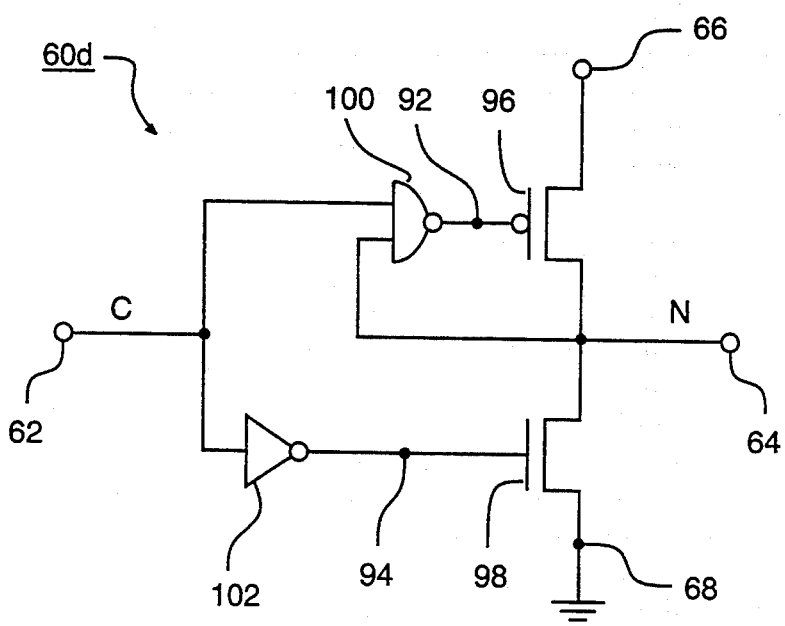

FIG. 5b shows a schematic of an embodiment 60d of a dynamic logic interconnect speed-up circuit according to the present invention. Embodiment 60d comprises network node 64, clock input node 62, supply voltage node 66, and ground node 68. Embodiment 60d further comprises an NMOS transistor 98 for precharging network node 64 to a low logic level, an intermediate node 94, and an inverter 102. NMOS transistor 98 has its gate electrode connected to intermediate node 94, has a first current electrode connected to network node 64, and has a second current electrode connected to ground node 68. Inverter 102 has its output connected to intermediate node 94, and has its input connected to clock input node 62. Embodiment 60d further comprises a PMOS transistor 96, an intermediate node 92, and a logic NAND gate 100. PMOS transistor 96 has its gate connected to intermediate node 92, has a first current electrode connected to supply voltage node 66, and has a second current electrode connected to network node 64. Logic NAND gate 100 has its output connected to intermediate node 92, has a first input connected to network node 64, and has a second input connected to clock input node 62.

The operation of embodiment 60d of FIG. 5b is the logic complement of the operation of embodiment 60c of FIG. 5a.

Figure 6A:
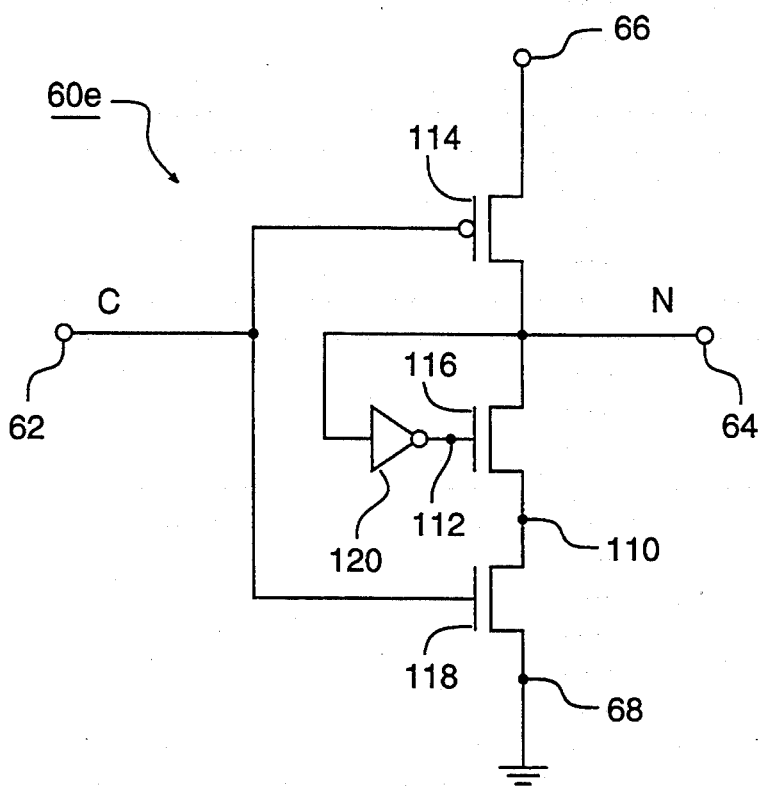

FIG. 6a shows a schematic of an embodiment 60e of a dynamic logic interconnect speed-up circuit according to the present invention. Embodiment 60e comprises network node 64, clock input node 62, supply voltage node 66, and ground node 68. Embodiment 60e further comprises a PMOS transistor 114 for precharging network node 64 to a high logic level, having its gate electrode connected to clock input node 62, having a first current electrode connected to network node 64, and having a second current electrode connected to supply voltage node 66. Embodiment 60e further comprises two NMOS transistor 116 and 118, two intermediate nodes 110 and 112, and an inverter 120. NMOS transistor 116 has its gate connected to intermediate node 112, has a first current electrode connected to network node 64, and has a second current electrode connected to intermediate node 110. NMOS transistor 118 has its gate connected to clock input node 62, has a first current electrode connected to intermediate node 110, and has a second current electrode connected to ground node 68. Inverter 120 has its output connected to intermediate node 112 and has its input connected to network node 64.

Still referring to FIG. 6a, when a low level is present on clock input node 62, PMOS transistor 114 is ON, while NMOS transistor 118 is OFF, acting as an open circuit. Hence, network node 64 is being precharged to a high level. Inverter 120 inverts the high level of network node 64 to a low level, on intermediate node 112, causing NMOS transistor 116 to be OFF. Since intermediate node 110 is now in between two NMOS transistors 116 and 118 in the OFF state, it is a floating node. The level present on intermediate node 110 depends on the charge that is present on intermediate node 110. However, this is not essential to the operation of the circuit.

When a high level is present on clock input node 62, PMOS transistor 114 is OFF, acting as an open circuit, while NMOS transistor 118 is ON. If meanwhile a high level is present on network node 64, due to capacitive storage after having been precharged, this high level is inverted by inverter 120 to a low level, appearing on intermediate node 112. This causes NMOS transistor 116 to be OFF, acting as an open circuit, and hence not influencing the level present on network node 64. However, if, while a high level is still present on clock input node 62, the level on network node 64, due to an external circuit, is forced lower, down to a value below the trip point of inverter 120, a high level appears on intermediate node 112. This causes NMOS transistor 116 to turn to the ON state, such that a conducting path is established from network node 64, through NMOS transistors 116 and 118, to ground node 68. As a result, network node 64 is actively pulled down by the circuitry of embodiment 60e.

If clock input node 62 turns back to the low logic level, network node 64 is being precharged again to the high logic level.

Figure 6B:
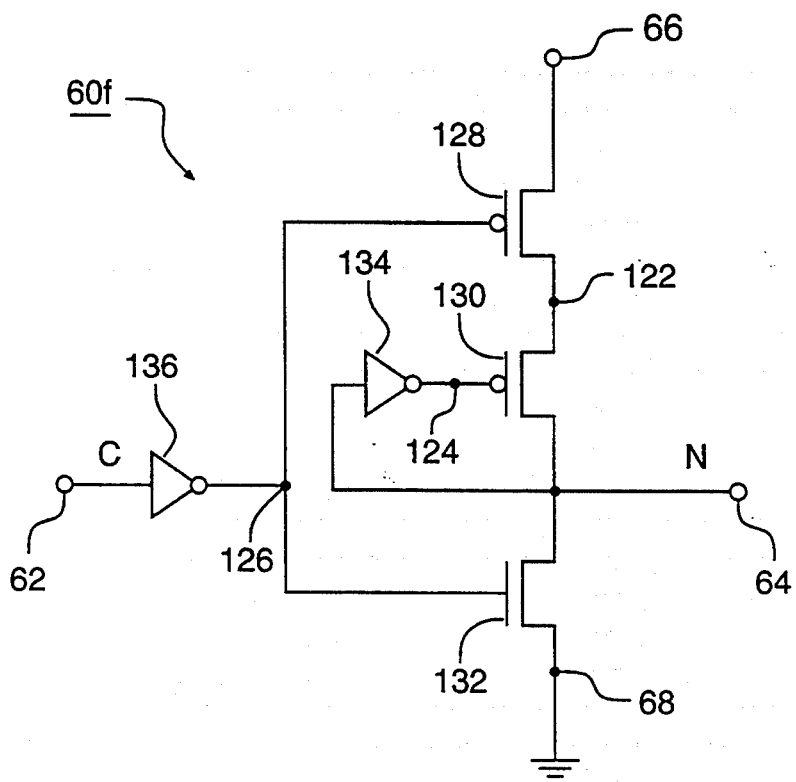

FIG. 6b shows a schematic of an embodiment 60f of a dynamic logic interconnect speed-up circuit according to the present invention. Embodiment 60f comprises network node 64, clock input node 62, supply voltage node 66, and ground node 68. Embodiment 60f further comprises an NMOS transistor 132 for precharging network node 64 to a low logic level, an intermediate node 126, and an inverter 136. NMOS transistor 132 has its gate electrode connected to intermediate node 126, has a first current electrode connected to network node 64, and has a second current electrode connected to ground node 68. Inverter 136 has its output connected to intermediate node 126, and has its input connected to clock input node 62. Embodiment 60f further comprises two PMOS transistor 128 and 130, two intermediate nodes 122 and 124, and an inverter 134. PMOS transistor 130 has its gate connected to intermediate node 124, has a first current electrode connected to network node 64, and has a second current electrode connected to intermediate node 122. PMOS transistor 128 has its gate connected to intermediate node 126, has a first current electrode connected to intermediate node 122, and has a second current electrode connected to supply voltage node 66. Inverter 134 has its output connected to intermediate node 124 and has its input connected to network node 64.

The operation of embodiment 60f of FIG. 6b is the logic complement of the operation of embodiment 60e of FIG. 6a.

It should be noted that embodiment 60c of FIG. 5a, embodiment 60d of FIG. 5b, embodiment 60e of FIG. 6a, and embodiment 60f of FIG. 6b all precharge their network nodes when the clock is low and monitor their network node when the clock is high. This requires an input circuit and receiver circuit that works under the correct clock phase, as is known to those of ordinary skill in the art.

Figure 7A:
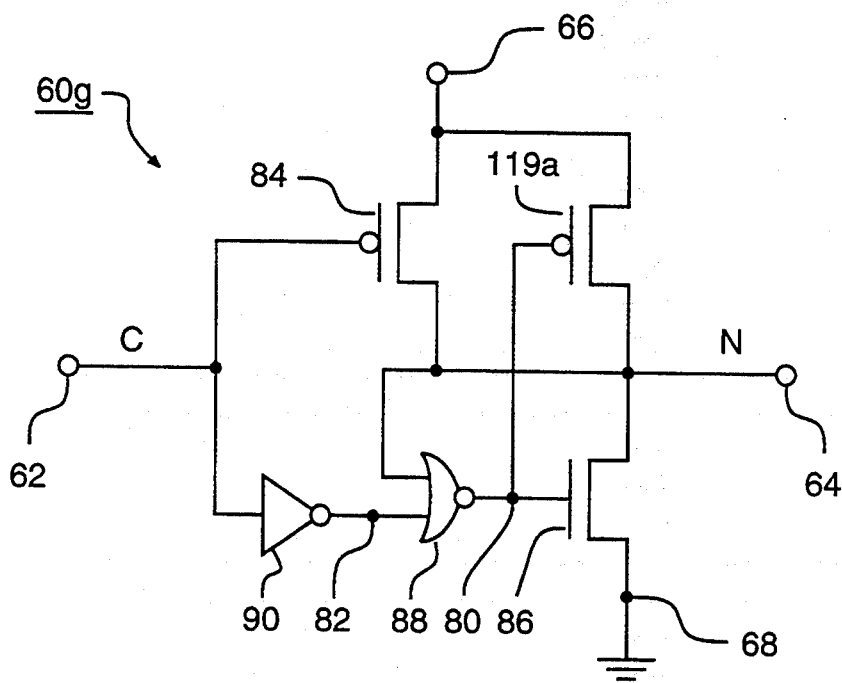

FIG. 7a shows a semi-static embodiment 60g of the dynamic logic interconnect speed-up circuit derived from embodiment 60c of FIG. 5a. The same reference labels are used in FIGS. 7a and 5a for like elements. Embodiment 60g comprises the same elements as comprised in embodiment 60c of FIG. 5a. In addition, embodiment 60g further comprises a PMOS transistor 119a, having its gate connected to intermediate node 80, having a first current electrode connected to network node 64, and having a second current electrode connected to supply voltage node 66.

Still referring to FIG. 7a, when a low level is present on clock input node 62, PMOS transistor 84 is ON. Inverter 90 inverts a low level on clock input node 62 to a high level on intermediate node 82. This causes the output of logic NOR gate 88, appearing on intermediate node 80, to be a low level, regardless of the level on the other input to logic NOR gate 88, which is connected to network node 64. As a result, when a low level is present on clock input node 62, NMOS transistor 86 is OFF, and PMOS transistor 119a is ON. Hence, network node 64 is precharged to a high level through both PMOS transistors 84 and 119a.

When a high level is present on clock input node 62, PMOS transistor 84 is OFF. Inverter 90 inverts the high level on clock input node 62 to a low level on intermediate node 82. As long as this low level is present on intermediate node 82, logic NOR gate 88 may be viewed as an inverting circuit with its input connected to network node 64 and its output connected to intermediate node 80. Thus, we may define the trip point of logic NOR gate 88 to be the trip point of the equivalent inverter when one of its inputs is a low level. If, while a high level is present on clock input node 62, a high level is present on network node 64, due to capacitive storage after having been precharged, the output of logic NOR gate 88, appearing on intermediate node 80, is low, and NMOS transistor 86 is OFF, while PMOS transistor 119a is ON. This ensures that when a high level is present on clock input node 62, the precharged high level on network node 64 is retained even if a high-resistive conducting path exists between network node 64 and ground node 68. However, if, while a high level is still present on clock input node 62, the level on network node 64, due to an external circuit with sufficiently low on-resistance, is forced lower, down to a value below the trip point of logic NOR gate 88, the output of logic NOR gate 88 turns into a high level, appearing on intermediate node 80. This causes NMOS transistor 86 to be turned ON, and PMOS transistor 119a to be turned OFF. As a result, network node 64 is pulled down by NMOS transistor 86. The on-resistance of the external circuit must be low enough in comparison with the on-resistance of PMOS transistor 119a, such that the external circuit can cause the level on network node 64 to drop sufficiently. This refers to the design of ratioed CMOS logic circuitry, as is known by those of ordinary skill in the art.

Figure 7B:
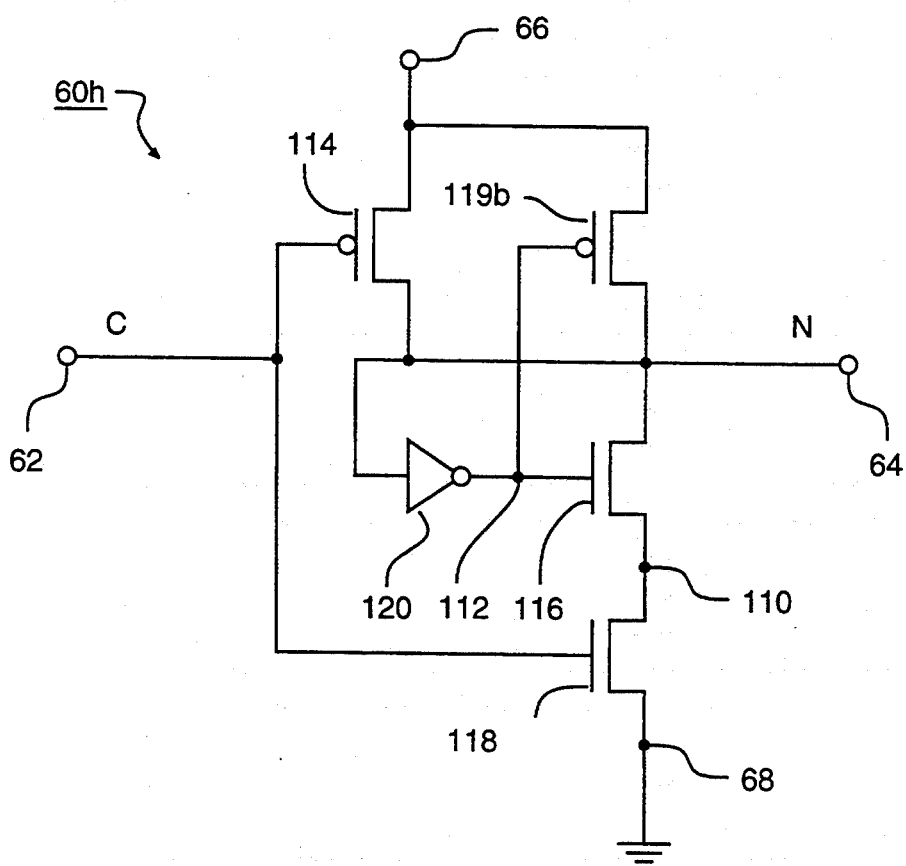

FIG. 7b shows a semi-static embodiment 60h of the dynamic logic interconnect speed-up circuit, derived from embodiment 60e of FIG. 6a. The same reference labels are used in FIGS. 7b and 6a for like elements. Embodiment 60h comprises the same elements as comprised in embodiment 60e of FIG. 6a. In addition, embodiment 60h further comprises a PMOS transistor 119b, having its gate connected to intermediate node 112, having a first current electrode connected to network node 64, and having a second current electrode connected to supply voltage node 66.

Still referring to FIG. 7b, when a low level is present on clock input node 62, PMOS transistor 114 is ON, while NMOS transistor 118 is OFF, acting as an open circuit. Hence, network node 64 is being precharged to a high level. Inverter 120 inverts this high level on network node 64 to a low level on intermediate node 112, causing NMOS transistor 116 to be OFF, and causing PMOS transistor 119b to be ON. Since intermediate node 110 is placed in between two NMOS transistors 116 and 118 in the OFF state, it is a floating node. The level present on node 112 depends on the charge that is present on intermediate node 110. However, this is not essential to the operation of the circuit.

Figure 8A:
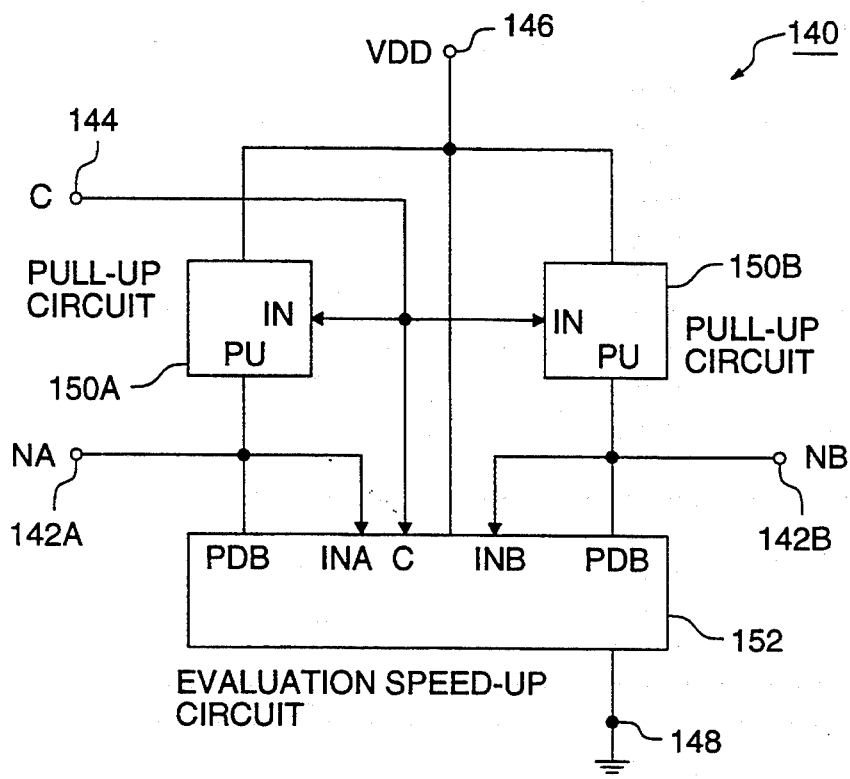
FIGS. 8a and 8b show embodiments of a bi-directional two-terminal bus repeater according to the present invention.

When a high level is present on clock input node 62, PMOS transistor 114 is OFF, acting as an open circuit, while NMOS transistor 118 is ON. If meanwhile a high level is present on network node 64, due to capacitive storage after having been precharged, this high level is inverted by inverter 120 to a low level, appearing on intermediate node 112. This causes NMOS transistor 116 to be OFF, acting as an open circuit, and causes PMOS transistor 119b to be ON. This ensures that when a high level is present on clock input node 62, the precharged high level on network node 64 is retained even if a high-resistive conducting path exists between network node 64 and ground node 68. However, if, while a high level is still present on clock input node 62, the level on network node 64, due to an external circuit with sufficiently low on-resistance, is forced lower, down to a value below the trip point of inverter 120, a high level appears on intermediate node 112. This causes PMOS transistor 119b to turn to the OFF state, now acting as an open circuit, and causes NMOS transistor 116 to turn to the ON state, such that a conducting path is established from network node 64, through NMOS transistors 116 and 118, to ground node 68. As a result, network node 64 is actively pulled down by the circuitry of embodiment 60e. The on-resistance of the external circuit must be low enough in comparison with the on-resistance of PMOS transistor 119b, such that the external circuit can cause the level on network node 64 to drop sufficiently. This refers to the design of ratioed CMOS logic circuitry, as is known by those of ordinary skill in the art. FIG. 8a shows a block diagram of an embodiment 140 of a bi-directional two-terminal bus repeater according to the present invention. Embodiment 140 comprises a network node 142A, also referred to as NA, a network node 142B, also referred to as NB, a clock input node 144, also referred to as C, a supply voltage node 146, also referred to as VDD, and a ground node 148. Embodiment 140 further comprises a pull-up circuit 150A for precharging of network node 142A to a high level, a pull-up circuit 150B for precharging of network node 142B to a high level, and an evaluation speed-up circuit 152. Pull-up circuit 150A has an input IN connected to clock input node 144, has a connection to supply voltage node 146, and has a pull-up terminal PU connected to network node 142A. Pull-up circuit 150B has an input IN connected to clock input node 144, has a connection to supply voltage node 146, and has a pull-up terminal PU connected to network node 142B. Evaluation speed-up circuit 152 has a clock input C connected to clock input node 144, has a connection to supply voltage node 146 and a connection to ground node 148, has a first input INA connected to network node 142A, has a second input INB connected to network node 142B, has a pull-down terminal PDA connected to network node 142A, and has a pull-down terminal PDB connected to network node 142B.

The operation of embodiment 140a shown in FIG. 8a is as follows. When the precharge clock level is asserted at input IN of pull-up circuits 150A or 150B, a low-impedance interconnection is established between supply voltage node 146 and the pull-up nodes PU connected to network nodes 142A or 142B, respectively. When the precharge clock level is asserted at clock input G of evaluation speed-up circuit 152, a high impedance, equivalent to an open circuit, is provided at pull-down terminals PDA and PDB, regardless of the level that is present at inputs INA and INB. As a result, when the precharge clock level is asserted on clock input 144, network nodes 142A and 142B are precharged to a high logic level through pull-up circuits 150A and 150B, respectively. When the evaluation clock level is asserted at clock input C of evaluation speed-up circuit 152, and high levels are present on both inputs INA and INB, evaluation speed-up circuit 152 is in its stand-by state, in which it provides a high impedance at pull-down terminals PDA and PDB, and meanwhile monitors the level at its inputs INA and INB. When a substantial deviation in logic level from the high level towards the low level is detected on either of inputs INA or INB, evaluation speed-up circuit 152 goes to its discharge state, in which it establishes a low-impedance interconnection between pull-down terminal PDA and ground node 148, as well as between pull-down terminal PDB and ground node 148. As a result, when the evaluation clock level is asserted at clock input 144, and a high level is present on both network nodes 142A and 142B, due to capacitive storage after having been precharged, both pull-up circuit 150A and evaluation speed-up circuit 152 provide a high impedance equivalent to an open circuit at network node 142A. Similarly, both pull-up circuit 150B and evaluation speed-up circuit 152 provide a high impedance equivalent to an open circuit at network node 142B. At this point, the level on either of network nodes 142A and 142B may be forced low by external circuits, not shown in FIG. 8a. If, while the evaluation clock level is asserted on clock input 144, the level on either of network nodes 142A or 142B drops below a predetermined threshold, due to a circuit external to the circuit shown in FIG. 8b, then a low impedance is established between network node 142A and the ground level, as well as between network node 142B and the ground level. This low impedance further enforces the level change that was imposed on one of network nodes 142A or 142B by an external circuit. In addition it enforces that level change onto the other of network nodes 142A or 142B, that was not forced down by an external circuit.

In this manner, a level change on a first node may be accelerated on that first node while it is also being propagated to a second node. This circuit is useful when two nodes with different capacitive loads are to be connected in a programmable interconnection architecture. Indeed, the driving strength of the pulldown circuits may be chosen in function of the capacitive load that must be driven. Moreover, this circuit hides the capacitive load of one node from the other node, since there is no direct resistive path from one node to the other. A connection from a node with a low capacitive load to a node with a high capacitive load can be faster and more reliably implemented using the embodiment of FIG. 8a compared to an implementation with a programmable switch between the two nodes and where interconnect speed-up circuit of FIG. 4b is placed at each node. This circuit may be used as an input/output circuit for off-chip communication, at the bonding pads of an integrated circuit. It should be noted that embodiment 140 of FIG. 8a is inherently bi-directional.

Figure 8B:
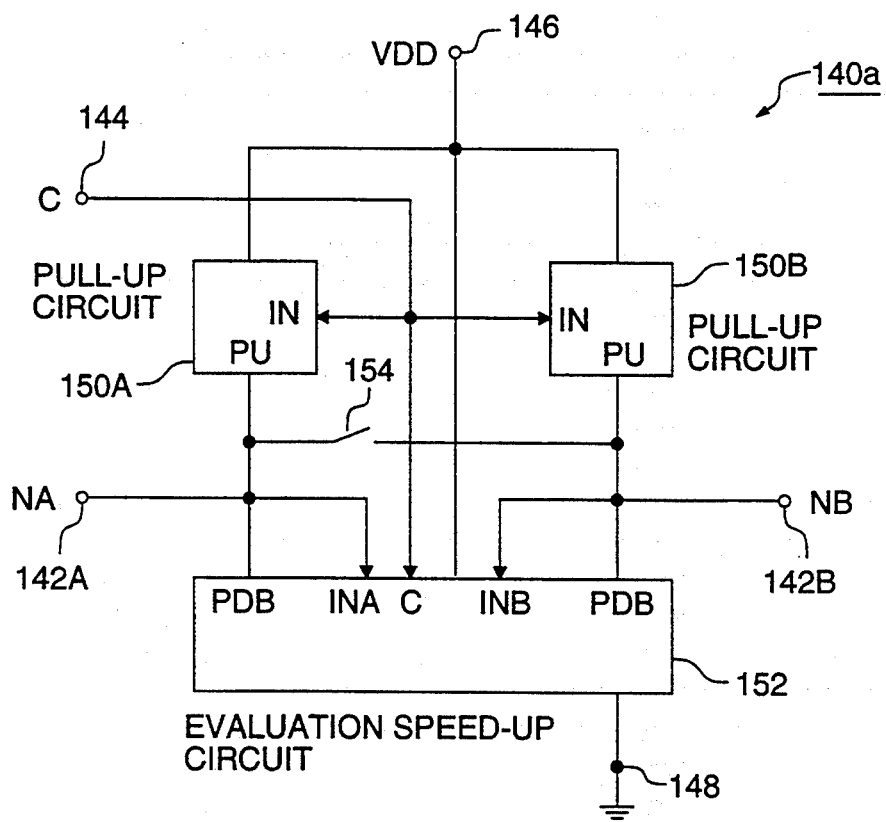

FIG. 8b shows another embodiment 140a of a bi-directional two-terminal bus repeater according to the present invention. The same reference labels are used in FIGS. 8b and 8a for like elements. Embodiment 140a comprises the same elements as comprised in embodiment 140 of FIG. 8a. In addition, embodiment 140a further comprises a programmable switch 154, having a first terminal connected to network node 142A and having a second terminal connected to network node 142B.

When programmable switch 154 is programmed to the non-conducting state, the operation of embodiment 140a in FIG. 8b is identical to the operation of embodiment 140 in FIG. 8a. In a bi-directional interconnection, a connection from a node with a high capacitive load to a node with a low capacitive load does not benefit from the fact that the circuit hides the low capacitive load on the receiving node from the high capacitive source node. In that case, it is advantageous to open programmable switch 154 between network nodes 142A and 142B, such that during a high-to-low level transition originating at the high-capacitive node, the low-capacitive node starts being discharged earlier, through programmable switch 154.

Figure 9:
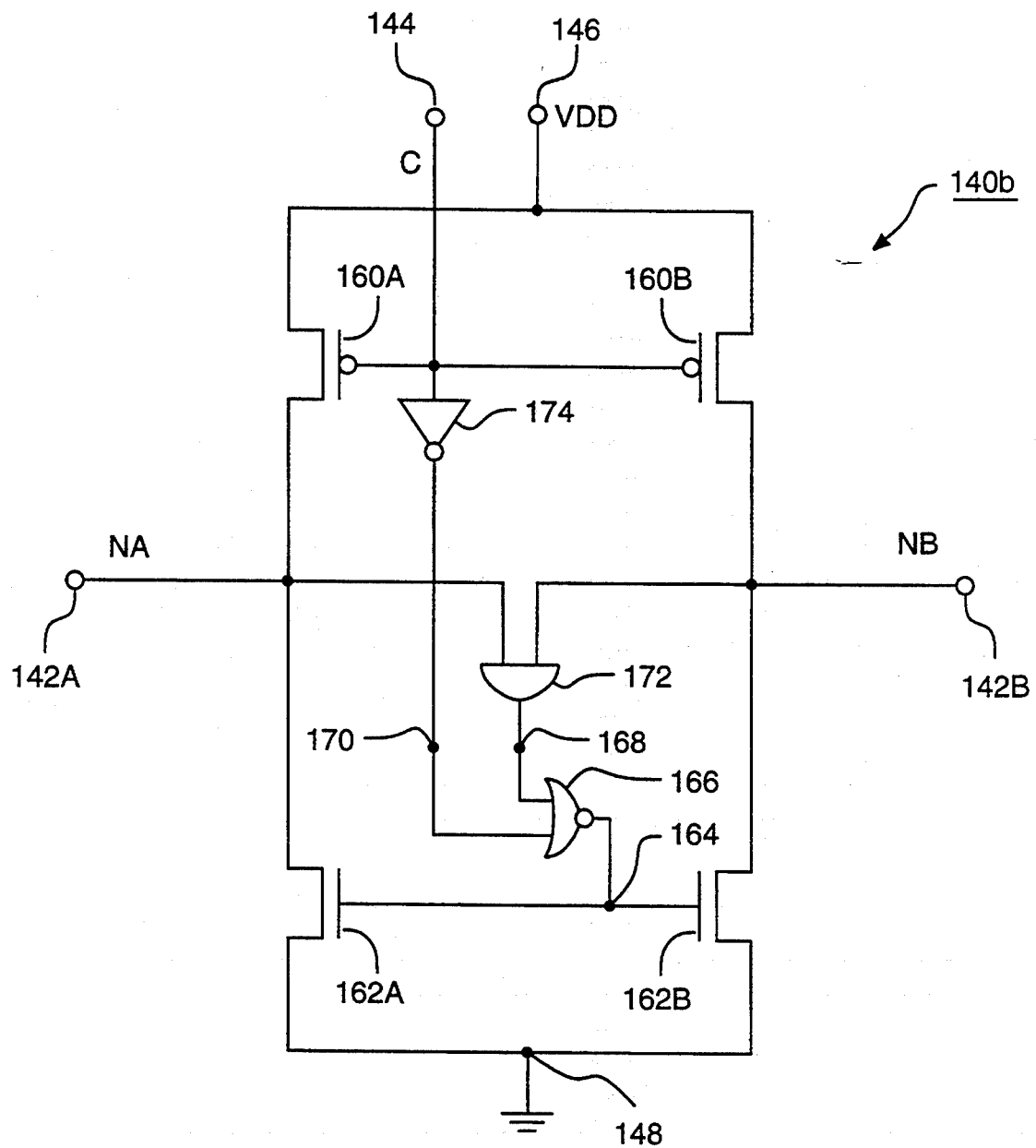

FIG. 9 shows another embodiment 140b of a bi-directional two-terminal bus repeater according to the present invention. The same reference labels are used in FIGS. 9 and 8a for like elements. Embodiment 140b comprises network nodes 142A and 142B, clock input node 144, supply voltage node 146, and ground node 148. Embodiment 140 further comprises two PMOS transistors 160A and 160B. PMOS transistor 160A has its gate connected to clock input node 144, has its first current electrode connected to supply voltage node 146, and has its second current electrode connected to network node 142A. PMOS transistor 160B has its gate connected to clock input node 144, has its first current electrode connected to supply voltage node 146, and has its second current electrode connected to network node 142B. Embodiment 140 further comprises two NMOS transistors 162A and 162B, three intermediate nodes 164, 168 and 170, a logic NOR gate 166 a logic AND gate 172, and an inverter 174. NMOS transistor 162A has its gate connected to intermediate node 164, has its first current electrode connected to ground node 148, and has its second current electrode connected to network node 142A. NMOS transistor 162B has its gate connected to intermediate node 164, has its first current electrode connected to ground node 148, and has its second current electrode connected to network node 142B. Logic NOR gate 166 has its output connected to intermediate node 164, has its first input connected to intermediate node 168, and has its second input connected to intermediate node 170. Logic AND gate 172 has its output connected to intermediate node 168, has its first input connected to network node 142A, and has its second input connected to network node 142B. Inverter 174 has its output connected to intermediate node 170 and has its input connected to clock input node 144.

Still referring to FIG. 9, when a low level is present on clock input node 144, PMOS transistors 160A and 160B are ON. Inverter 174 inverts a low level on clock input node 144 to a high level on intermediate node 170. This causes the output of logic NOR gate 166, appearing on intermediate node 164, to be a low level, regardless of the level on the other input to logic NOR gate 166, which is connected to intermediate node 168. As a result, when a low level is present on clock input node 144, both NMOS transistors 162A and 162B are OFF, and network nodes 142A and 142B are being precharged to a high level through PMOS transistors 160A and 160B, respectively.

When a high level is present on clock input node 144, PMOS transistors 160A and 160B are both OFF. Inverter 174 inverts the high level on clock input node 144 to a low level on intermediate node 170. As long as this low level is present on intermediate node 170, logic NOR gate 166 may be viewed as an inverting circuit with its input connected to intermediate node 168 and its output connected to intermediate node 164. The level of intermediate node 168 is the output of logic AND gate 172, of which the inputs are connected to network nodes 142A and 142B. We now define the trip point of logic AND gate 172 as the trip point of the equivalent buffer circuit obtained when one input to logic AND gate 172 is kept high. If, while a low level is present on clock input node 144, a high level is present on both network nodes 142A and 142B, due to capacitive storage after having been precharged, the output of logic AND gate 172, appearing on intermediate node 168, is high; the output of logic NOR gate 166, appearing on intermediate node 164, is low; and both NMOS transistors 162A and 162B are OFF. However, if, while a low level is still present on clock input node 144, the level on either of network nodes 142A or 142B, due to an external circuit, is forced lower, down to a value below the trip point of logic AND gate 172, the output of logic AND gate 172 turns into a low level, appearing on intermediate node 168; and the output of logic NOR gate 166 turns into a high level, appearing on intermediate node 164. This causes both NMOS transistors 162A and 162B to be turned ON. As a result, both network nodes 142A and 142B are pulled down.

Embodiment 140b in FIG. 9 is based on the dynamic logic interconnect speed-up circuit of FIG. 5a. Similarly, an embodiment based on the dynamic logic interconnect speed-up circuit of FIG. 6a, having two NMOS transistors in series in each pull-down network, can be derived. However, since the bi-directional two-terminal bus repeater is used to drive large capacitive loads, such as in I/O circuitry, it is preferable not to use a pull-down circuit with two NMOS transistors in series, and instead to use the embodiment 140b in FIG. 9, which has only one NMOS transistor in the pull-down path.

Figure 10:
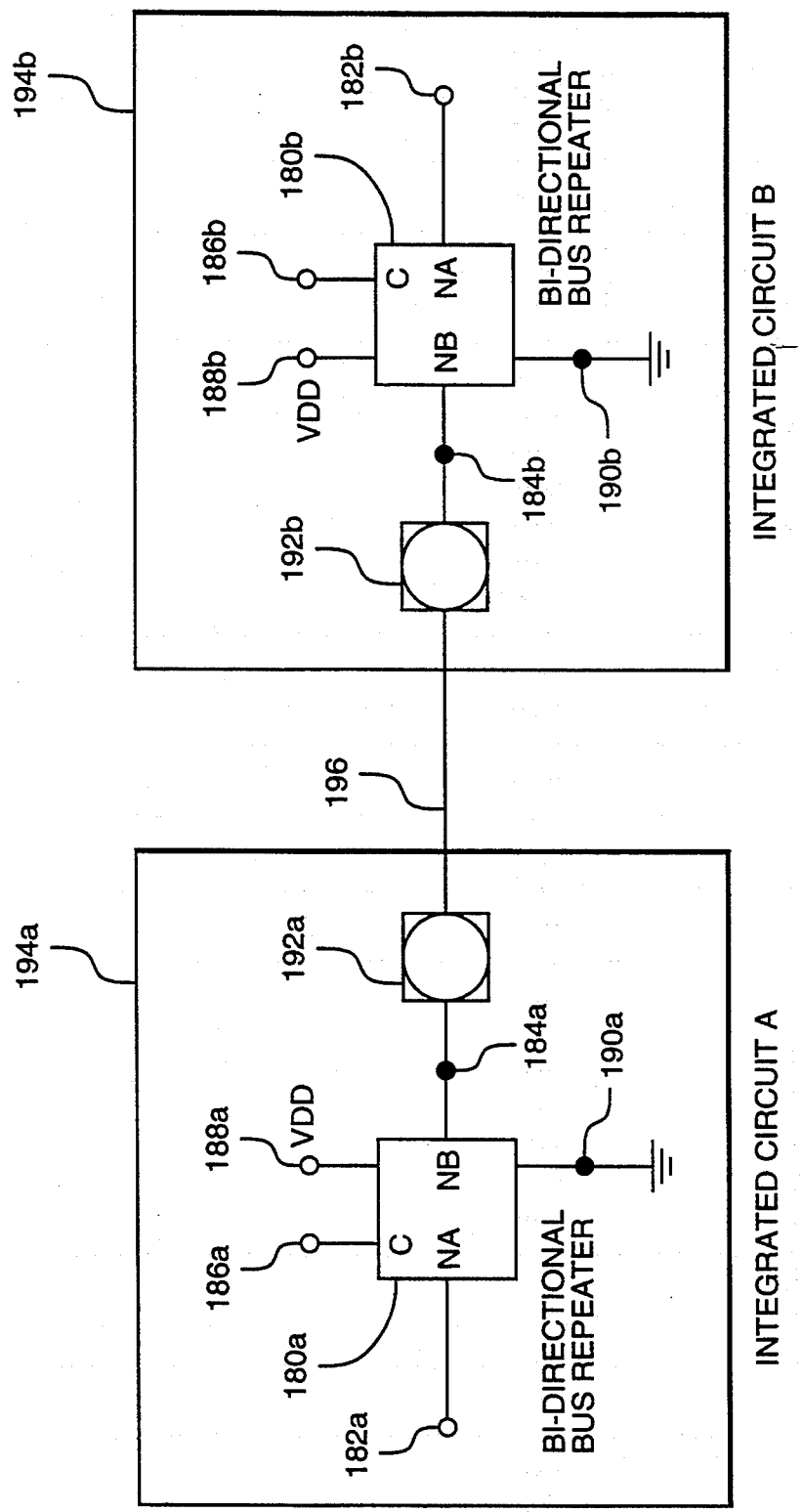

FIG. 10 shows a view of an illustrative embodiment of the bi-directional two-terminal bus repeater according to the present invention. FIG. 10 shows a first integrated circuit 194a, a first bonding pad 192a, a second integrated circuit 194b, a second bonding pad 192b, and a conductive trace 196 for providing an inter-chip interconnection between bonding pad 192a and bonding pad 192b. Integrated circuit 194a further comprises a bi-directional two-terminal bus repeater 180a according to the present invention, having a connection to a ground node 190a, a supply voltage node 188a, a clock input node 186a, a network node 182a, and a network node 184a. Network node 184a is also connected to bonding pad 192a. Integrated circuit 194b further comprises a bi-directional two-terminal bus repeater 180b according to the present invention, having a connection to a ground node 190b, a supply voltage node 188b, a clock input node 186b, a network node 182b, and a network node 184b. Network node 184a is also connected to bonding pad 192b.

During the precharge phase, network nodes 182a, 184a, 184b and 182b; as well as bonding pads 192a and 192b; as well as conductive trace 196, are precharged to a high level by bi-directional two-terminal bus repeater circuits 180a and 180b. During the evaluation phase, a high-to-low level change imposed on network node 182a is accelerated on network node 182a, and is propagated onto network node 184a, bonding pad 192a, conductive trace 196, bonding pad 192b, and network node 182b, by bi-directional two-terminal bus repeater circuit 180a. The high-to-low level change of network node 184b is then accelerated on network node 184b and is propagated on network node 182b, by bi-directional two-terminal bus repeater circuit 180b.

It can be shown that ringing due to transmission line effects, more specifically due to reflections, is negligible in this arrangement. This is due to the fact that the bi-directional two-terminal bus repeater circuit not only propagates the high-to-low level change, but in addition enforces it on the node where the level change first appeared. Hence, during the period of time where reflections would be most significant, both bonding pads 192a and 192b at the ends of the line are being actively pulled down by bi-directional two-terminal bus repeater circuits 180a and 180b, respectively. The pull-down devices at both ends of the line dampen the reflections faster than in a conventional source-terminated CMOS I/O circuit, where only at the source end an active pull-down is present.

The same circuit arrangement may be used for on-chip connections.

It may also be advantageous to place several of the dynamic logic interconnect speed-up circuits at regular distances along a single on-chip line, in order to speed up the communication along the line - for example, if the capacitive loading of the line is high due to added source and drain capacitances of connected circuits.

All circuits described herein may be used in combination with compatible existing dynamic and static circuits.

This detailed description of this invention is meant to be illustrative only and not limiting. Other embodiments of this invention will be obvious to those skilled in the art in view of this disclosure. More in particular, based on the embodiments shown in this application, embodiments may be derived that employ NMOS transistors, PMOS transistors, bipolar transistors, heterojunction bipolar transistors, MESFETS, and any other types of electrical or electro-optical switching devices, or combinations thereof.

The dynamic logic interconnect speed-up circuit of the present invention may be used for differential signaling by employing two parallel interconnection paths, one propagating the true value of a variable and the other propagating its inverse. The noise immunity of a differential signal, appearing as a value on a first network node and as the inverse value on a second network node, may be improved by adding two cross-connected PMOS transistors: each PMOS transistor has a first current electrode connected to the supply voltage node and a second current electrode connected to the first or second network node, with the gate connected to the other network node.

What is claimed is:

1. In an integrated circuit, a programmable interconnect architecture, comprising:
   a plurality of wiring segments interconnected by a plurality of programmable switches, each of said programmable switches having two terminals, and each of said switches being characterized by a first programming state in which a low impedance bi-directional electrical connection is provided between said two terminals, and by a second programming state in which a high impedance is provided between said two terminals,
   a plurality of dynamic logic circuits, each having a clock input node, a network node, a precharge circuit and an evaluation circuit,
   said precharge circuit providing means to charge said network node to a first logic level when a predetermined logic level is asserted on said clock input node,
   said evaluation circuit providing means to detect a deviation larger than a predetermined threshold from said first logic level towards a second logic level on said network node while said predetermined logic level is not asserted on said clock input node, and providing means to charge said network node to said second logic level after detection of said deviation and for the period of time while said predetermined logic level remains not asserted on said clock input node,
   and wherein at least some of said wiring segments of said routing network are each directly connected to a matching one of said network nodes of said dynamic logic circuits.

2. In an integrated circuit, a bi-directional bus repeater, comprising:
   a dynamic logic circuit, having a clock input node, first and second network nodes, first and second precharge circuits, and an evaluation circuit,
   said first and second precharge circuits providing means to charge said first and second network nodes to a first logic level when a predetermined logic level is asserted on said clock input node,
   said evaluation circuit having a first input terminal connected to said first network node, a first output terminal connected to said first network node, a second input terminal connected to said second network node, and a second output terminal connected to said second network node,
   said evaluation circuit providing means to detect a deviation larger than a predetermined threshold from said first logic level towards a second logic level on said first network node while said predetermined logic level is not asserted on said clock input node, and providing means to charge said first and second network nodes to said second logic level after detection of said deviation and for the period of time while said predetermined logic level remains not asserted on said clock input node,
   said evaluation circuit providing means to detect a deviation larger than a predetermined threshold from said first logic level towards a second logic level on said second network node while said predetermined logic level is not asserted on said clock input node, and providing means to charge said first and second network nodes to said second logic level after detection of said deviation and for the period of time while said predetermined logic level remains not asserted on said clock input node.

* * * * *